(12) United States Patent
Onishi

(10) Patent No.: US 6,838,913 B2
(45) Date of Patent: Jan. 4, 2005

(54) CHARGE/DISCHARGE CURRENT DETECTION CIRCUIT AND VARIABLE RESISTOR

(75) Inventor: Kota Onishi, Nagoya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/349,309

(22) Filed: Jan. 22, 2003

(65) Prior Publication Data

US 2003/0169078 A1 Sep. 11, 2003

(30) Foreign Application Priority Data

Jan. 23, 2002 (JP) ........................... 2002-014605

(51) Int. Cl.[7] ................. G01R 19/00; H03K 5/153
(52) U.S. Cl. ........................... 327/58; 327/72
(58) Field of Search ................. 327/415–417, 327/112, 270–272, 276, 281, 389, 403, 58, 69, 18–20, 26–27, 37, 52, 56, 60, 62–63, 70, 72, 78–81, 89, 333; 326/30, 87

(56) References Cited

U.S. PATENT DOCUMENTS

| | | | | |
|---|---|---|---|---|
| 5,434,717 A | * | 7/1995 | Yoshinaga et al. | 360/46 |
| 5,739,707 A | * | 4/1998 | Barraclough | 327/112 |
| 5,898,321 A | * | 4/1999 | Ilkbahar et al. | 326/87 |
| 6,642,742 B1 | * | 11/2003 | Loyer | 326/30 |

FOREIGN PATENT DOCUMENTS

| | | |
|---|---|---|
| JP | 62-206455 | 9/1987 |
| JP | 11-234915 | 8/1999 |
| JP | 2000-028654 | 1/2000 |
| JP | 2000-155138 | 6/2000 |

* cited by examiner

*Primary Examiner*—My-Trang Nu Ton
(74) *Attorney, Agent, or Firm*—Hogan & Hartson, LLP

(57) ABSTRACT

A charge/discharge current detection circuit includes a detection resistance that converts a charge current and a discharge current to a detection voltage, a level shifter circuit that level-shifts the detection voltage by a predetermined value, and an amplifier circuit that amplifies an output voltage of the level shifter circuit and outputs the amplified output voltage of the level shifter circuit. The level shifter circuit applies to the detection voltage a predetermined divided voltage obtained by resistance-dividing a reference voltage, to thereby level-shift the detection voltage.

14 Claims, 7 Drawing Sheets

CHARGE/DISCHARGE CURRENT DETECTION CIRCUIT AND VARIABLE RESISTOR

BACKGROUND OF THE INVENTION

1. Field of the Invention

The present invention relates to a charge/discharge current detection circuit that detects a charge current when charging a battery (chargeable secondary battery, storage battery and the like) and its discharge current, and a variable resistor that is preferentially used as a component of the charge/discharge current detection circuit.

2. Description of the Related Art

Conventionally, a circuit shown in FIG. 6, for example, is known as a charge/discharge current detection circuit of this type.

As shown in FIG. 6, the charge/discharge current detection circuit is formed from components such as a detection resistance Rs, a charge current monitor amplifier 1, a discharge current monitor amplifier 2, a buffer amplifier 3, and an offset voltage adjusting circuit 4.

The detection resistance Rs is used to detect a charge current to a battery, or to detect a discharge current from the battery to a load. The charge current monitor amplifier 1 is an amplifier circuit that is composed of an operation amplifier OP1 and resistances RC1 and RC2. The discharge current monitor amplifier 2 is an amplifier circuit that is composed of an operation amplifier OP2 and resistances RD1 and RD2. An output from either the charge current monitor amplifier 1 or the discharge current monitor amplifier 2 can be retrieved by selectively switching switches SW1 and SW2.

The buffer amplifier 3 is composed of an operation amplifier OP3 and resistances R1–R4. The offset voltage adjusting circuit 4 can set a desired offset voltage by an externally provided instruction at the time of adjusting the offset voltage.

Next, operations of the charge/discharge current detection circuit having the structure described above are described with reference to FIG. 6.

First, the description is made as to a case when the switch SW1 is closed, and the charge current monitor amplifier 1 detects a charge current to a battery. In this case, because the charge current flows through the detection resistance Rs in a direction indicated in FIG. 6 such that a voltage is generated, a voltage drop is applied to a (+) input terminal of the operation amplifier OP1, and the applied voltage is amplified and outputted.

On the other hand, when the switch SW2 is closed, and the discharge current monitor amplifier 2 detects a discharge current from the battery to a load, the discharge current flows through the detection resistance Rs in a direction indicated in FIG. 6 such that a voltage is generated, and a voltage drop is applied to a (+) input terminal of the operation amplifier OP2, and the applied voltage is amplified and outputted.

Due to the fact that there are different offset voltages present respectively for the charge current monitor amplifier 1 and the discharge current monitor amplifier 2 in the conventional charge/discharge current detection circuit, the offset voltages need to be set independently from one another by the offset voltage adjusting circuit 4, and the setting operation is complicated, which is inconvenient.

Also, due to the fact that the two amplifiers, the charge current monitor amplifier 1 and the discharge current monitor amplifier 2, are used, the gain and other characteristic factors (linearity error or the like) at the time of detecting a charge current are different from those at the time of detecting a discharge current, such that the charge current and the discharge current cannot be correctly compared, which is also inconvenient.

To solve the inconveniences described above, the present inventors have made diligent research and studies, and as a result, invented a novel charge/discharge current detection circuit.

In the mean time, the novel charge/discharge current detection circuit needed a variable resistor. However, it became clear that the use of a conventional variable resistor, for example, the one shown in FIG. 7, would cause the following problems. The problems will be described below.

In the conventional variable resistor shown in FIG. 7, resistances R11–R16 are serially connected to one another, and MOS transistors Q1–Q6 are connected as switches to both ends of the respective resistances R11–R16. The MOS transistors Q1–Q6 are controlled to be turned on and off to set a desired resistance value.

Here, resistance values of the resistances R11–R16 have a relation in which, when the resistance value of the resistance R1 is R [Ω], the resistance values of the resistances R12–R16 are 2×R, 4×R, 8×R, . . . , respectively.

However, since the conventional variable resistor uses MOS transistors that are turned on and off, their ON resistance becomes problematical. For example in FIG. 7, when a state in which only the MOS transistor Q1 is in an ON state (a state of the maximum resistance value) changes drastically to a state in which the MOS transistors Q2–Q6 are in an ON state (a state of the minimum resistance value), it assumes a state in which the ON resistances of the respective MOS transistors Q2–Q6 are serially connected to the resistance R11, and the sum of the ON resistances becomes an error, which is problematical.

For this reason, conventionally, the resistance value of the resistance R11 needs to be made large, or the transistor size needs to be made larger to reduce the ON resistances of the MOS transistors in order to solve the problems described above.

Accordingly, in view of the aspects discussed above, it is a first advantage of the present invention to provide a charge/discharge current detection circuit in which the detection of charge current and discharge current can be conducted under the same operational conditions, characteristic factors of an amplifier circuit have similar influences upon detecting charge current and discharge current such that the charge current and discharge current can be correctly compared, and offsets can be readily adjusted.

Also, it is a second advantage of the present invention to provide a variable resistor that can adjust the resistance valve with a high degree of accuracy and is suitable for, for example, a charge/discharge current detection circuit or the like.

SUMMARY OF THE INVENTION

To achieve the first advantage of the present invention, the present invention provides a charge/discharge current detection circuit that detects a charge current to a battery and a discharge current to be supplied from the battery to a load, and includes a detection resistance that converts a charge current and a discharge current to a detection voltage; a level shifter circuit that level-shifts the detection voltage by a predetermined value; and an amplifier circuit that amplifies an output voltage of the level shifter circuit and outputs the amplified output voltage of the level shifter circuit. The level shifter circuit applies to the detection voltage a predetermined divided voltage obtained by resistance-dividing a reference voltage, to thereby level-shift the detection voltage.

The level shifter circuit includes a first voltage divider resistance and a second voltage divider resistance, wherein one end of the first voltage divider resistance is connected to one end of the detection resistance, and a reference voltage is applied to another end of the first voltage divider resistance; and one end of the second voltage divider resistance is connected to another end of the detection resistance, and the reference voltage is applied to another end of the second voltage divider resistance. A divided voltage of the first voltage divider resistance and a divided voltage of the second voltage divider resistance are taken out as output voltages.

The amplifier circuit is an instrumentation amplifier and at least one of the first voltage divider resistance and the second voltage divider resistance includes a variable resistor.

The variable resistor includes a first circuit having m serial circuits connected in parallel, each having a resistance and a switch connected in serial, a second circuit having n serial circuits connected in parallel, each having a resistance and a switch connected in serial, and a selection device that closes specified ones of the switches to selects specified resistances. The first circuit and the second circuit are serially connected to each other each of the first circuit and the second circuit includes a switch added in parallel therewith, and the switch is composed of MOS transistors, and the selection device is composed of a decoder circuit.

With the charge/discharge current detection circuit in accordance with the present invention having such structures, the common amplifier circuit can be used under the same operational condition at the time of detecting charge current and discharge current. For this reason, the characteristic factors of the amplifier circuit have the same influences at the time of charging and discharging, and therefore the charge current and the discharge current can be correctly compared with each other.

Also, in the charge/discharge current detection circuit of the present invention, the detection of charge current and discharge current can be conducted by a common amplifier circuit, and therefore the offset adjustment of the amplifier circuit can be readily conducted.

In addition, to achieve the second advantage of the present invention, there is provided a variable resistor including a first circuit having m serial circuits connected in parallel, each having a resistance and a switch connected in serial; a second circuit having n serial circuits connected in parallel, each having a resistance and a switch connected in serial; and a selection device that closes specified ones of the switches to selects specified resistances. The first circuit and the second circuit are serially connected the first circuit and the second circuit includes a switch added in parallel therewith and the switch is composed of MOS transistors, and the selection device is composed of a decoder circuit.

With the variable resistor in accordance with the present invention having such structures described above, only one of the switches on the first circuit side can be turned on to select a desired resistance, and only one of the switches on the second circuit side can be turned on to select a desired resistance. For this reason, when any of the switches is selected, the selected resistance includes, in addition to a resistance value of the selected resistance, a resistance value of the ON resistance of the switches. As a result, the resistance value can be adjusted with a high degree of accuracy.

DETAILED DESCRIPTION OF THE PREFERRED EMBODIMENTS

Embodiments of the present invention are described below.

First, a charge/discharge current detection circuit in accordance with an embodiment of the present invention is described with reference to FIG. 1.

Figure 1:
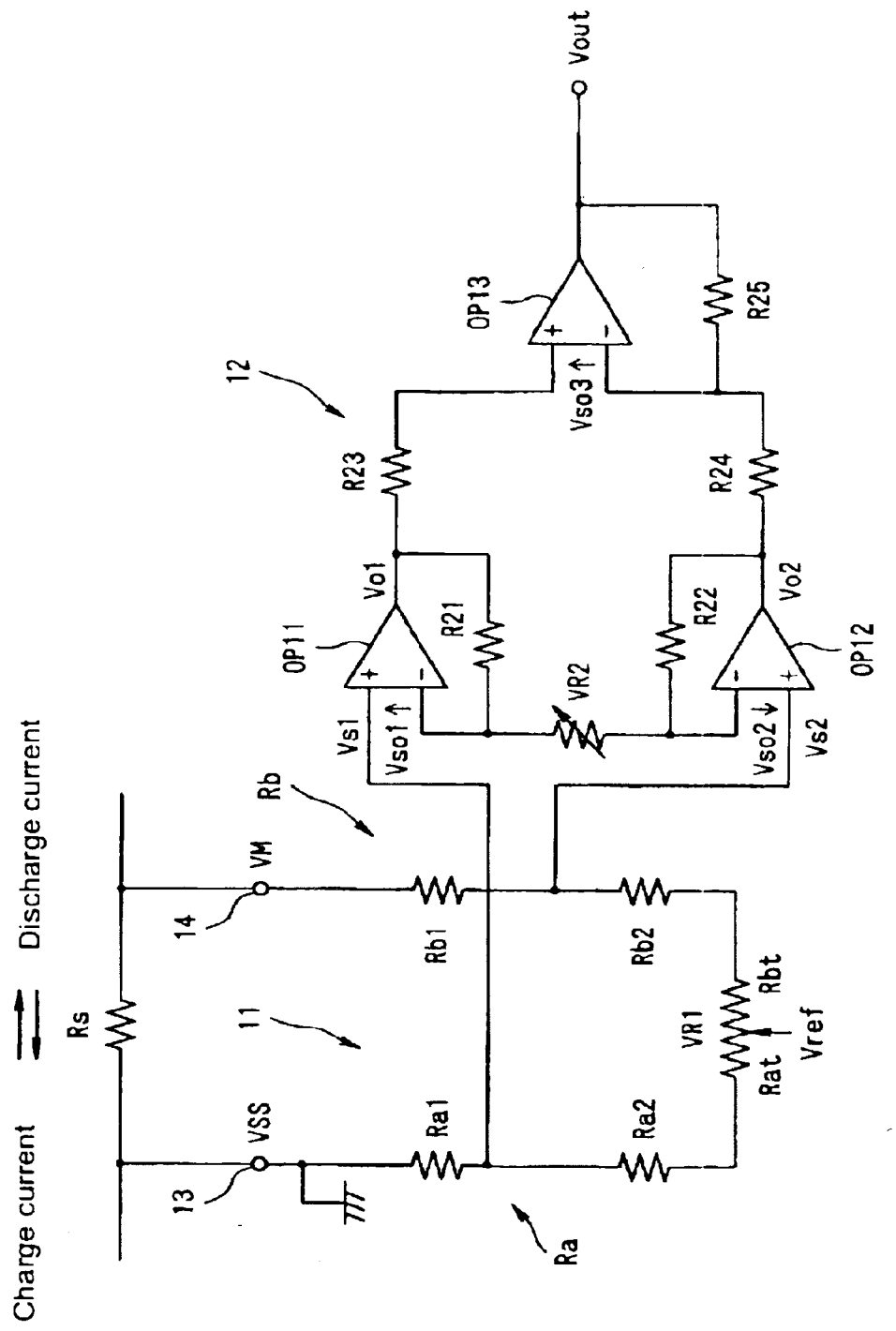
FIG. 1 is a circuit diagram of a structure of a charge/discharge current detection circuit in accordance with an embodiment of the present invention.

As shown in FIG. 1, the charge/discharge current detection circuit in accordance with the present embodiment is equipped with a detection resistance Rs that converts a charge current to a battery (not shown) and a discharge current supplied from the battery to a load to detection voltages, respectively, a level shifter circuit 11 that level-shifts the detection voltage by a predetermined amount, and an instrumentation amplifier 12 as an amplifier circuit that amplifies an output voltage of the level shift circuit and amplifies the same;

The detection resistance Rs is used with both its ends connected to detection resistance connection terminals 13 and 14. The detection resistance connection terminal 13 is grounded.

The level shifter circuit 11 applies to the detection voltage of the detection resistance Rs a predetermined divided voltage that is obtained by resistance-dividing a reference voltage Vref, thereby level-shifting the detection voltage. More specifically, the level shifter circuit 11 is composed of a first voltage divider resistance Ra and a second voltage divider resistance Rb.

The first voltage divider resistance Ra is formed from a resistance Ra1, a resistance Ra2 and a part of a variable resistor VR1, which forms a serial circuit, wherein one end of the resistance Ra1 is connected to one end of the detection resistance Rs such that the reference voltage Vref can be applied to a slide terminal (moveable terminal) of the variable resistor VR1.

The second voltage divider resistance Rb is formed from a resistance Rb1, a resistance Rb2 and a part of the variable resistor VR1, which forms a serial circuit, wherein one end of the resistance Rb1 is connected to the other end of the detection resistance Rs such that the reference voltage Vref can be applied to the slide terminal of the variable resistor VR1.

Furthermore, the level shifter circuit 11 takes out a divided voltage Vs1 of the first voltage divider resistance Ra and a divided voltage Vs2 of the second voltage divider resistance Rb, and supplies the same to the instrumentation amplifier 12.

The instrumentation amplifier 12 is formed from, as indicated in FIG. 1, operation amplifiers OP11–OP13, a variable resistor VR2 and resistances R21–R25.

More specifically, the operation amplifier OP11 has its (+) input terminal connected to a common connection section of the resistance Ra1 and the resistance Ra2, and its (−) input terminal connected through a resistance R21 to its output terminal. The operation amplifier OP12 has its (+) input terminal connected to a common connection section of the resistance Rb1 and the resistance Rb2, and its (−) input terminal connected through a resistance R22 to its output terminal. The (−) input terminal of the operation amplifier OP11 and the (−) input terminal of the operation amplifier OP12 are connected to each other through a variable resistor VR2.

Also, the output terminal of the operation amplifier OP11 is connected through a resistance R23 to a (+) input terminal of the operation amplifier OP13, and the output terminal of the operation amplifier OP12 is connected through a resistance R24 to a (−) input terminal of the operation amplifier OP13. Further, the operation amplifier 13 has its (−) input terminal connected through a resistance R25 to its output terminal, and an output voltage Vout is taken out from the output terminal of the operation amplifier 13.

Figure 2:
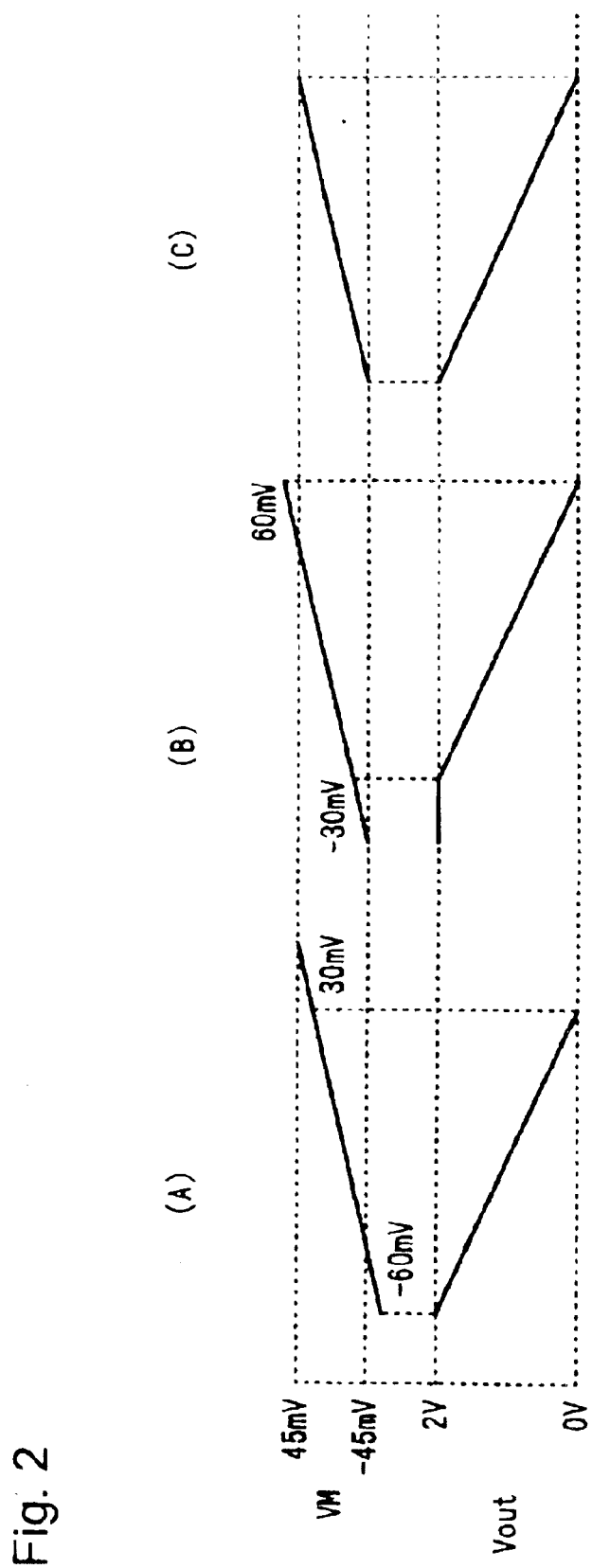
FIG. 2 is an illustration to be used to describe an adjusting method of the present embodiment.
Figure 3:
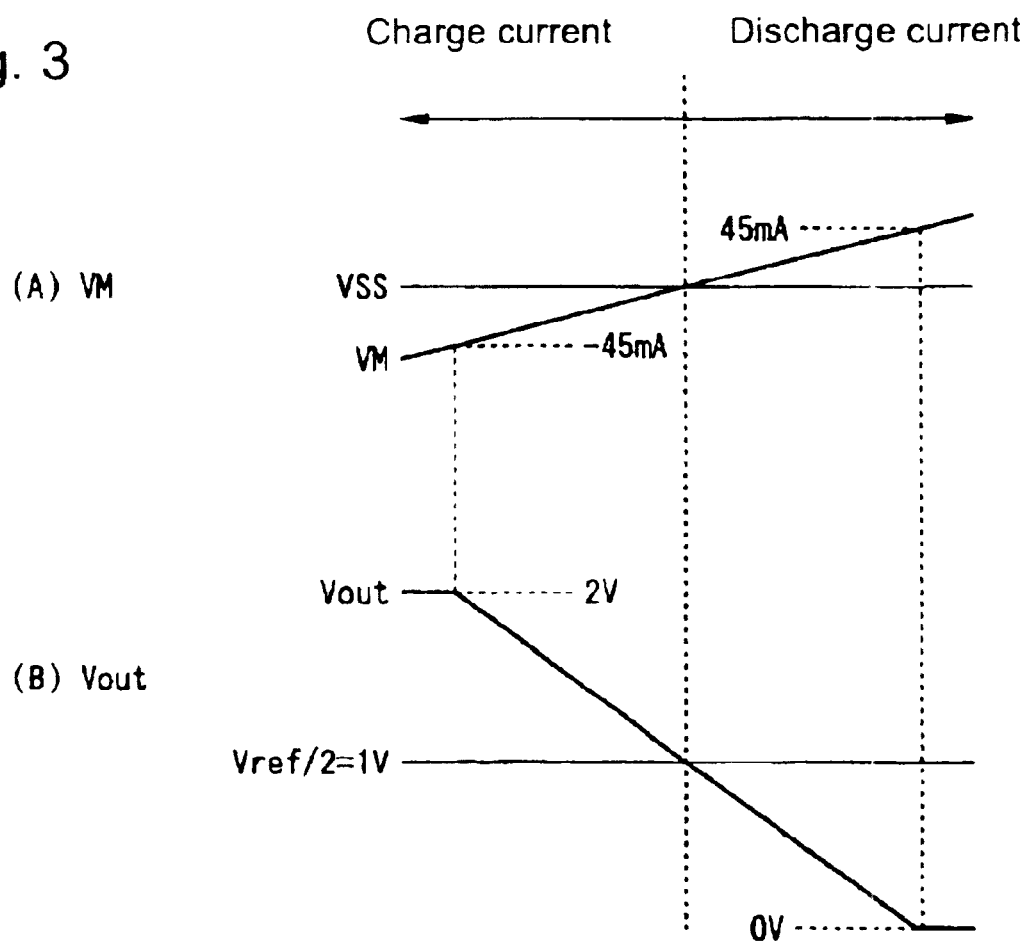
FIG. 3 is an illustration to be used to describe a relation between detection voltages and output voltages of the present embodiment.

Next, an example of the operations of the charge/discharge current detection circuit having such a structure described above in accordance with the present embodiment will be described with reference to FIGS. 1–3.

With this charge/discharge current detection circuit, as indicated in FIG. 1, a voltage VSS of the detection resistance output terminal 13 connected to the detection resistance Rs and a voltage VM on the detection resistance connection terminal 14 are pulled up by the first voltage divider resistance Ra and the second voltage divider resistance Rb that compose the level shifter circuit 11, and the reference voltage Vref. Accordingly, input voltages Vs1 and Vs2 of the instrumentation amplifier 12 are given by Formulas (1) and (2) as follows:

$$Vs1=VSS+(Vref-VSS)\times[Ra1/(Ra1+Ra2+Rat)] \quad (1)$$

$$Vs2=VM+(Vref-VM)\times[Rb1/(Rb1+Rb2+Rbt)] \quad (2)$$

Here, the resistances Rat and Rbt of the variable resistor VR1 are adjusted to meet Formula (3) as follows, with variations of the first voltage divider resistance Ra and second voltage divider resistance Rb, and offset voltages Vos1 and Vos2 of the respective operation amplifiers OP11 and OP12 being taken into consideration.

$$Vref\times[Ra1/(Ra1+Ra2+Rat)]-Vos1=Vref\times[Rb1/(Rb1+Rb2+Rbt)]-Vos2=k \quad (3)$$

When the resistances Rat and Rbt of the variable resistor VR1 are adjusted to meet Formula (3), output voltages Vo1 and Vo2 of the respective operation amplifiers OP11 and OP12 are given by Formulas (4) and (5) as follows:

$$Vo1=[1+(R21+R22)/VR2]\times[(Vref-VSS)\times Ra1/(Ra1+Ra2+Rat)-Vos1]=[1+(R21+R22)/VR2]\times k \quad (4)$$

$$Vo2=[1+(R21+R22)/VR2]\times[(Vref-VM)\times Rb1/(Rb1+Rb2+Rbt)-Vos2]=[1+(R21+R22)/VR2]\times k-[1+(R21+R22)/VR2]\times VM\times[Rb1/(Rb1+Rb2+Rbt)] \quad (5)$$

According to Formulas (4) and (5), a differential voltage Vo of the output voltages Vo1 and Vo2 of the respective operation amplifiers OP11 and OP12 is given by Formula (6) as follows:

$$Vo=Vo1-Vo2=[1+(R21+R22)/VR2]\times VM\times[Rb1/(Rb1+Rb2+Rbt)] \quad (6)$$

It is understood from Formula (6) that the differential voltage Vo amplifies the voltage VM on the detection resistance connection terminal 14.

Next, when an offset voltage of the operation amplifier OP13 is Vos3, an output voltage Vout of the operation amplifier OP13 is given by Formula (7) as follows:

$$Vout=Vs1-[(R25/R24)\times(Vo-Vos3)]=Vref\times[Ra1/(Ra1+Ra2+Rat)]-(R25/R24)\times[1+(R21+R22)/VR2]\times VM\times[Rb1/(Rb1+Rb2+Rbt)]+[(R25/R24)\times Vos3] \quad (7)$$

In Formula (7), $-(R25/R24)\times[1+(R21+R22)/VR2]$ is defined as a gain.

Also, $-(R25/R24)\times[1+(R21+R22)/VR2]\times[Rb1/(Rb1+Rb2+Rbt)]$ is defined as a total gain Gain.

Here, a value of $(R25/R24)\times Vos3$ is very small, and therefore can be omitted. For this reason, when the resistances Rat and Rbt satisfy Formula (3), the output voltage Vout shifts upward (in a positive direction) when the resistance Rat is small, and the output voltage Vout shifts downward (in a negative direction) when the Rbt is small.

Accordingly, through adjusting the resistances Rat and Rbt such that the charge voltage and discharge voltage both become their maximum values, adjustments which take variations of relative values of the resistances and offset voltage of the instrumentation amplifier 12 into consideration can be made.

Next, one example of the adjustment will be described below. This adjustment is conducted with the gain of the instrumentation amplifier 12 being maximized.

More specifically, as indicated in FIG. 2(A), when the voltage VM on the detection resistance connection terminal 14 is in a rage, for example, between −60 mV and 30 mV, the variable resistor VR1 is adjusted such that the resistance Rat is smaller and the resistance Rbt is larger.

On the other hand, as indicated in FIG. 2(B), when the voltage VM on the detection resistance connection terminal 14 is in a rage, for example, between −30 mV and 60 mV, the variable resistor VR1 is adjusted such that the resistance Rat is larger and the resistance Rbt is smaller.

As a result of such adjustment, when the voltage VM becomes, for example, between −45 mV and 45 mV, as indicated in FIG. 2(C), the adjustment of the variable resistor VR1 is completed.

As described above, the aforementioned adjustments are necessary because there are variations in the resistance values of the first voltage divider resistance Ra and second voltage divider resistance Rb, and offset voltages Vos1 and Vos2 of the respective operation amplifiers OP11 and OP12. In this connection, typical values of the variations in the resistance values and offset voltages will be described.

For example, when ion-implanted layered resistances are used as the first voltage divider resistance Ra and the second voltage divider resistance Rb, relative variations of their resistance values would be ±2%. Also, the offset voltage of an operation amplifier is about 3 to 10 mV. When, there are two operation amplifiers OP1 and OP2, the output voltage Vout would have an error of a maximum of 20 mV. Further, when the reference voltage Vref is 2 V, and relative variations of their values are 2%, the output voltage Vout would have an error of 40 mV.

Accordingly, when the voltage VM on the detection resistance connection terminal 14 is in a range between −45 mV and 45 mV, the aforementioned adjustment is necessary.

In the charge/discharge current detection circuit, a value of the output voltage Vout on the instrumentation amplifier 12 in an initial state (when a current Is flowing in the detection resistance Rs is 0) is stored in a memory (not shown), and output voltages Vout of the instrumentation amplifier 12 at the time of charging or discharging are compared with the initial voltage to detect charge currents or discharge currents. The details thereof are described below.

First, MOS transistors for charging (not shown) and MOS transistors for discharging are both turned to an OFF state. In this state, an output voltage Vout of the instrumentation amplifier 12 at each of the total Gains is obtained, and the output voltage Vout is A/D converted by an A/D converter (not shown) and stored in a flash memory (not shown). These values would become the detection voltage value Vs1 in the case of the discharge current Is=0.

Next, operations that take place when a charge current is detected with the detection resistance Rs will be described.

In this case, the MOS transistors for charging and MOS transistors for discharging are both turned to an ON state, and the battery is connected to a charger. By so doing, as indicated in FIG. 1, a charge current Is flows through the detection resistance Rs in a direction indicated in the figure, such that a negative voltage of (Is×Rs) is generated on the detection resistance connection terminal 14. The voltage VM on the detection resistance connection terminal 14 and the output voltage Vout of the instrumentation amplifier 12 have a relation like the one at charging, for example, as shown in FIG. 3.

At this moment, the voltage VM on the detection resistance connection terminal 14 and the output voltage Vout of the instrumentation amplifier 12 are given by Formulas (8) and (9) as follows:

$$VM = (Is \times Rs) \quad (8)$$

$$Vout = Vs1 - Gain \times VM \quad (9)$$

The charge current Is is given by Formula (10) as follows based on Formulas (8) and (9).

$$Is = -(Vout - Vs1) \div Gain \div Rs (Vout > Vs1) \quad (10)$$

Where, Vs1 is an output voltage Vout (Is=0) of the instrumentation amplifier at each total gain Gain.

Next, operations that take place when a discharge current is detected with the detection resistance Rs will be described.

In this case, the MOS transistors for charging and MOS transistors for discharging are both turned to an ON state, and the battery is connected to a charger. By so doing, as indicated in FIG. 1, a charge current Is flows through the detection resistance Rs in a direction indicated in the figure, such that a positive voltage of (Is×Rs) is generated on the detection resistance connection terminal 14. The voltage VM on the detection resistance connection terminal 14 and the output voltage Vout of the instrumentation amplifier 12 have a relation like the one at discharging, for example, as shown in FIG. 3.

At this moment, the discharge current Is is given by Formula (11) as follows:

$$Is - (Vout - Vs1) \div Gain \div Rs (Vout > Vs) \quad (10)$$

Here, the calculation above would result in Is≦0 upon charging, and Is≧0 upon discharging. However, due to error factors at the time of detecting, a minute current may become Is<0 upon charging, and Is>0 upon discharging. In this case, the calculation is made with Is=0.

The measurable range of discharge currents is determined by the detection resistance Rs and total gain Gain. For example, as indicated in FIG. 2, when the total gain Gain is 22 (Gain=22), and when the output voltage Vout of the instrumentation amplifier 12 is between 0 V and 2 V, the voltage VM on the detection resistance connection terminal 14 is between −45 mV and 45 mV. It is noted that, depending on the accuracy of the offset adjustment, the voltage VM on the detection resistance connection terminal 14 which can be actually used is, for example, between −35 mV and 35 mV.

Also, when the detection resistance Rs is 0.2 [Ω], the discharge current Is is between −175 mV and 175 mV. As a result, when a 10-bit A/D converter to be connected to an output side of the instrumentation amplifier 12 is used, its minimum resolution is 0.45 mA.

As described above, by the charge/discharge current detection circuit in accordance with the present embodiment, a common instrumentation amplifier (amplifier circuit) can be used under the same operational condition when detecting charge currents and discharge currents. For this reason, characteristic factors of the amplifier have the same effects both at the time of charging and discharging, and therefore the charge current and discharge current can be correctly compared with one another.

Also, by the charge/discharge current detection circuit in accordance with the present embodiment, a common instrumentation amplifier is used to detect charge currents and discharge currents, an offset voltage of the amplifier can be adjusted by a single adjustment.

Next, a modified example of the level shifter circuit 11 shown in FIG. 1 will be described with reference to FIG. 4.

A level shifter circuit 11A of the modified example is formed from a first voltage divider resistance Ra' that includes a variable resistor VR3, and a second voltage divider resistance Rb' that does not includes a variable resistor, wherein a reference voltage Vref is applied to a common connection section of the first voltage divider resistance Ra' and the second voltage divider resistance Rb'.

More specifically, the first voltage divider resistance Ra' has a resistance Ra1, a resistance Ra2 and the variable resistor VR3 serially connected to one another, wherein one end of the resistance Ra1 is connected to a detection resistance connection terminal 13 such that the reference voltage Vref is applied to one end of the variable resistor VR3. Further, a divided voltage Vs1 is taken out from the common connection section of the resistance Ra1 and the resistance Ra2.

Also, the second voltage divider resistance Rb' has a resistance Rb1 and a resistance Rb2 serially connected to each other, wherein one end of the resistance Rb1 is connected to a detection resistance connection terminal 14 such that the reference voltage Vref is applied to one end of the resistance Rb2. Further, a divided voltage Vs2 is taken out from the common connection section of the resistance Rb1 and the resistance Rb2.

Here, exemplary values of the resistances Ra1 and Ra2 and the resistances Rb1 and Rb2 are as follows: Ra1=100 KΩ, Ra2=92 KΩ, and Rb1=Rb2=100 KΩ. Also, resistance values of the variable resistor VR1 can be changed in a range between 0 KΩ and 16 KΩ.

Next, a structure of a variable resistor in accordance with an embodiment of the present invention is described with reference to FIG. 5.

Figure 5:
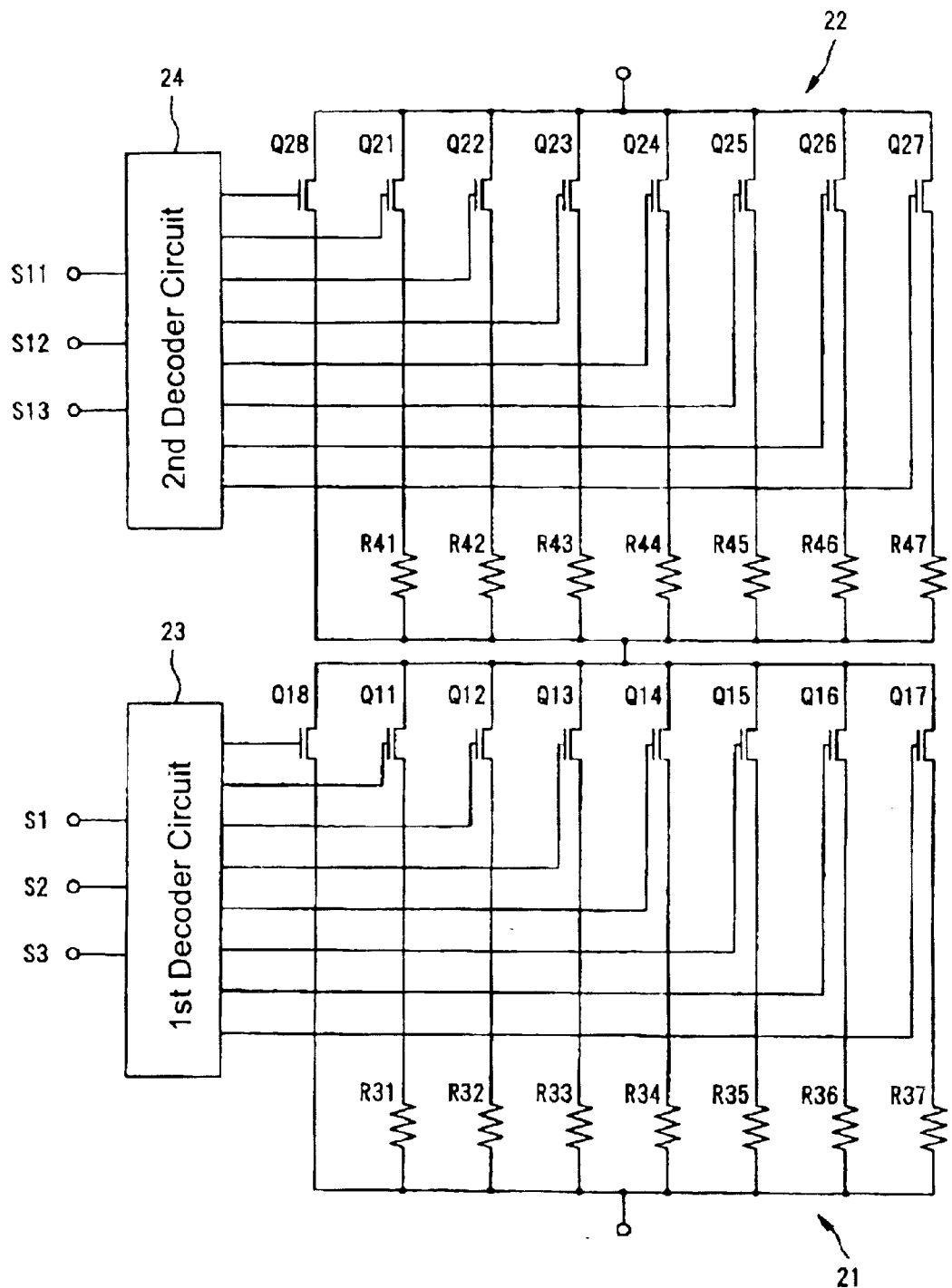
FIG. 5 is a circuit diagram of a structure of a variable resistor in accordance with an embodiment of the present invention.
Figure 6:
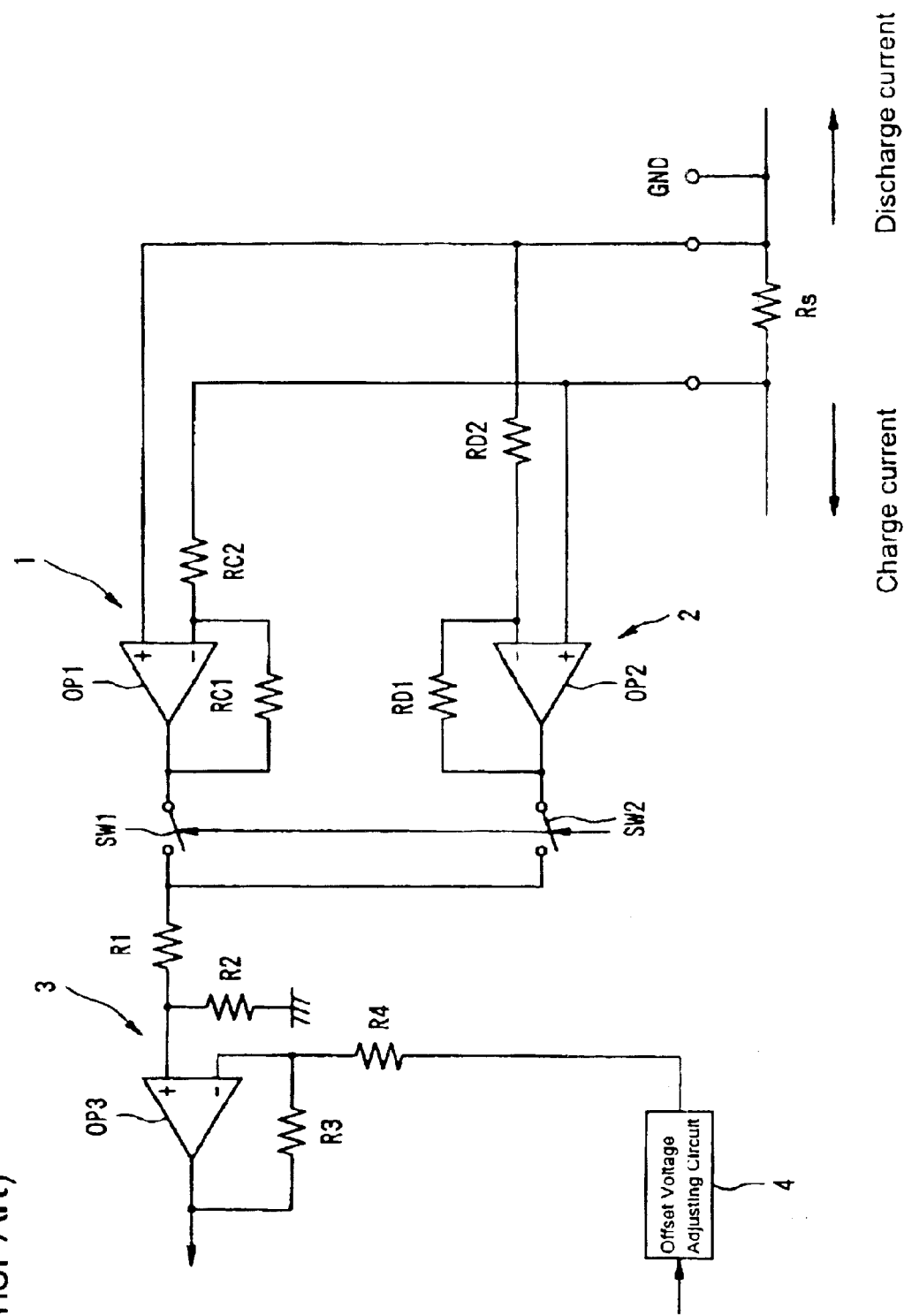
FIG. 6 is a circuit diagram of a structure example of a conventional charge/discharge current detection circuit.
Figure 7:
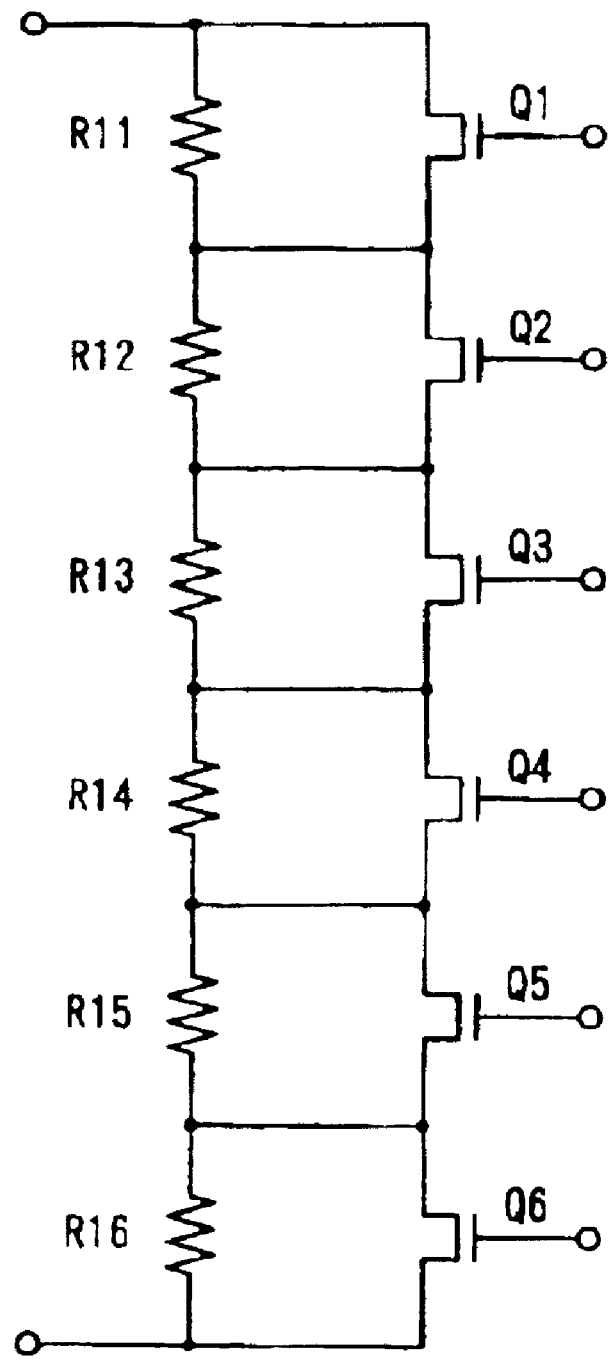
FIG. 7 is a circuit diagram of a structure example of a conventional variable resistor.

The variable resistor in accordance with the present embodiment is equipped with, as indicated in FIG. 5, a first circuit 21 that is formed from a combination of resistances R31–R37 and MOS transistors Q11–Q18, a second circuit 22 that is formed from a combination of resistances R41–R47 and MOS transistors Q21–Q28, a first decoder circuit that turns on the MOS transistors Q11–Q18 as switches, and a second decoder circuit 24 that turns on the MOS transistors Q21–Q28 as switches, wherein the first circuit 21 and the second circuit 22 are serially connected to each other.

More specifically, the first circuit 21 has m number (in this example, 7) of serial circuits in which the resistances R31–R37 are serially connected to the corresponding respective MOS transistors Q11–Q17, which are connected in parallel with one another, and the MOS transistor Q18 is further connected in parallel to these serial circuits.

The first circuit 22 has n number (in this example, 7) of serial circuits in which the resistances R41–R47 are serially connected to the corresponding respective MOS transistors Q21–Q27, which are connected in parallel with one another, and the MOS transistor Q28 is further connected in parallel to these serial circuits.

The first decoder circuit 23 turns on one of the MOS transistors Q11–Q18 based on input signals S1–S3, to select an optional resistance among the resistances R31–R37, or to place an optional resistance in a short-circuit state by non-selecting the resistance.

The second decoder circuit 24 turns on one of the MOS transistors Q21–Q28 based on input signals S11–S13, to select an optional resistance among the resistances R41–R47, or to place an optional resistance in a short-circuit state by non-selecting the resistance.

Here, resistance values of the resistances R31–R37 and the resistances R41–R47 may have the following relations as an example. Namely, when the resistance R31 has a value R, the resistances R32–R37 have values 2R, 3R, 4R, 5R, 6R and 7R, respectively, and the resistances R41–R47 have values 8R, 16R, 24R, 32R, 40R, 48R and 56R, respectively.

Accordingly, for example, when R31=250 $\Omega$, R32=500 $\Omega$, R33=750 $\Omega$, R34=1000 $\Omega$, R35=1250 $\Omega$, R36=1500 $\Omega$, R37=1750 $\Omega$. Furthermore, R41=2 K$\Omega$, R42=4 K$\Omega$, R43=6 K$\Omega$, R44=8 K$\Omega$, R45=10 K$\Omega$, R46=12 K$\Omega$, and R47=14 K$\Omega$.

Also, the MOS transistors Q11–Q18 and the MOS transistors Q21–Q28 are formed in the same transistor size.

Next, an example of operations of the variable resistor having such a structure in accordance with the present embodiment is described with reference to FIG. 5.

When predetermined input signals S1–S3 are inputted in the first decoder circuit 23, one of the MOS transistors Q11–Q18 is turned on accordingly. If, for example, the MOS transistor Q11 is turned on, the resistance R31 would be selected in the first circuit 21.

Next, when predetermined input signals S11–S13 are inputted in the second decoder circuit 24, one of the MOS transistors Q21–Q28 is turned on accordingly. If, for example, the MOS transistor Q24 is turned on, the resistance R44 would be selected in the second circuit 22.

In this manner, as the resistance R31 and the resistance R44 are selected, these resistances are placed in a serially connected state, and the total resistance value would be (R31+R44). In this instance, this resistance value includes resistance values of respective on-resistances of the MOS transistor Q11 and MOS transistor Q24.

On the other hand, let us assume a case in which the MOS transistor Q11 in the first circuit 21 is turned on such that the resistance R31 is selected, and the MOS transistor Q28 in the second circuit 22 is turned on such that any of the resistances are not selected but short-circuited. In this case, the total resistance value would be R31, and the resistance value includes resistance values of respective on-resistances of the MOS transistor Q11 and MOS transistor Q28.

In this manner, in the variable resistor in accordance with the present embodiment, only one of the MOS transistors on the side of the first circuit 21 is turned on to select a desired resistance, and only one of the MOS transistors on the side of the second circuit 22 is turned on to select a desired resistance. As a result, no matter which resistances are selected, the resistance value of the selected resistances includes resistance values of on-resistances of the MOS A transistors, which allows adjustments of resistance values with a high precision.

Figure 4:
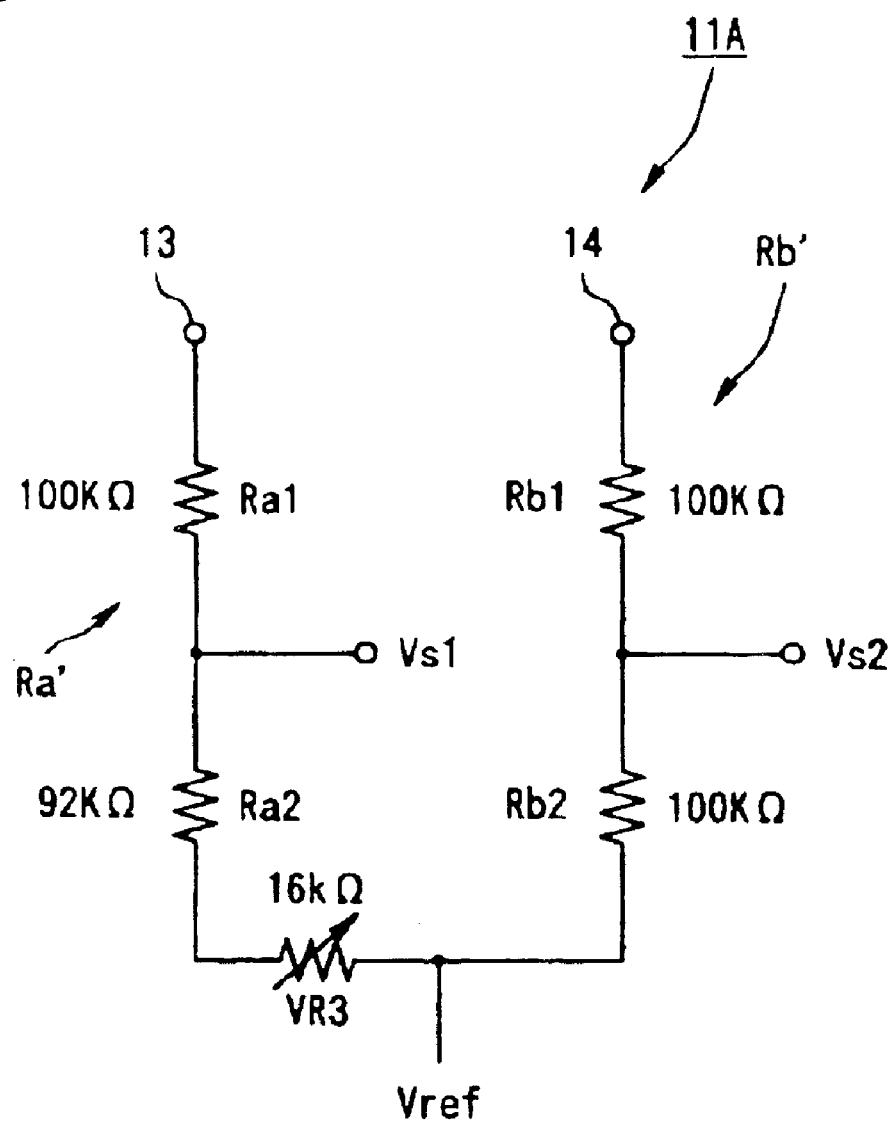
FIG. 4 is a circuit diagram of a structure of a modified example of a level shifter circuit.

Also, the variable resistor in accordance with the present embodiment is suitable for a variable resistor VR3 of the level shifter circuit 11A shown in FIG. 4.

As described above, with the charge/discharge current detection circuit in accordance with the present invention, a common amplifier circuit can be used under the same operational condition at the time of detecting charge current and discharge current. For this reason, the characteristic factors of the amplifier circuit have the same influences at the time of charging and discharging, and therefore the charge current and the discharge current can be correctly compared with each other.

Also, in the charge/discharge current detection circuit of the present invention, the detection of charge current and discharge current can be conducted by a common amplifier circuit, and therefore the offset adjustment of the amplifier circuit can be readily conducted.

Furthermore, by the charge/discharge current detection circuit of the present invention, only one of the switches on the side of the first circuit can be turned on to select a desired resistance, and only one of the switches on the side of the second circuit can be turned on to select a desired resistance. As a result, no matter which resistances are selected, the resistance value of the selected resistances includes resistance values of on-resistances of the transistors, which allows adjustments of resistance values with a high precision.

What is claimed is:

1. A charge/discharge current detection circuit comprising:
   a detection resistance that converts a charge current and a discharge current to a detection voltage;
   a level shifter circuit that level-shifts the detection voltage by a predetermined value; and
   an amplifier circuit that amplifies an output voltage of the level shifter circuit and outputs the amplified output voltage of the level shifter circuit,
   wherein the level shifter circuit applies to the detection voltage a predetermined divided voltage obtained by resistance-dividing a reference voltage, to thereby level-shift the detection voltage.

2. A charge/discharge current detection circuit according to claim 1,
   wherein the level shifter circuit comprises a first voltage divider resistance and a second voltage divider resistance,
   wherein one end of the first voltage divider resistance is connected to one end of the detection resistance, and a reference voltage is applied to another end of the first voltage divider resistance; and one end of the second voltage divider resistance is connected to another end of the detection resistance, and the reference voltage is applied to another end of the second voltage divider resistance, and wherein a divided voltage of the first voltage divider resistance and a divided voltage of the second voltage divider resistance are taken out as output voltages.

3. A charge/discharge current detection circuit according to claim 2, wherein at least one of the first voltage divider resistance and the second voltage divider resistance includes a variable resistor.

4. A charge/discharge current detection circuit according to claim 3, wherein the variable resistor comprises a first circuit having m serial circuits connected in parallel, each having a resistance and a switch connected in serial, a second circuit having n serial circuits connected in parallel, each having a resistance and a switch connected in serial, and a selection device that closes specified ones of the switches to selects specified resistances, wherein the first circuit and the second circuit are serially connected.

5. A charge/discharge current detection circuit according to claim 4, wherein each of the first circuit and the second circuit includes a second switch added in parallel therewith.

6. A charge/discharge current detection circuit according to claim 4, wherein the switch is composed of MOS transistors, and the selection device is composed of a decoder circuit.

7. A charge/discharge current detection circuit according to claim 1, wherein the amplifier circuit is an instrumentation amplifier.

8. A charge/discharge current detection circuit comprising:
- a detection resistance that converts a charge current and a discharge current to a detection voltage;
- means for level-shifting the detection voltage by a predetermined value; and
- an amplifier circuit that amplifies an output voltage of the means for level-shifting and outputs the amplified output voltage of the means for level-shifting,
- wherein the means for level-shifting applies to the detection voltage a predetermined divided voltage obtained by resistance-dividing a reference voltage, to thereby level-shift the detection voltage.

9. A charge/discharge current detection circuit according to claim 8,
wherein the means for level-shifting comprises a first voltage divider resistance and a second voltage divider resistance, wherein one end of the first voltage divider resistance is connected to one end of the detection resistance, and a reference voltage is applied to another end of the first voltage divider resistance; and one end of the second voltage divider resistance is connected to another end of the detection resistance, and the reference voltage is applied to another end of the second voltage divider resistance, and wherein a divided voltage of the first voltage divider resistance and a divided voltage of the second voltage divider resistance are taken out as output voltages.

10. A charge/discharge current detection circuit according to claim 9, wherein at least one of the first voltage divider resistance and the second voltage divider resistance includes a variable resistor.

11. A charge/discharge current detection circuit according to claim 10, wherein the variable resistor comprises a first circuit having m serial circuits connected in parallel, each having a resistance and a switch connected in serial, a second circuit having n serial circuits connected in parallel, each having a resistance and a switch connected in serial, and a selection device that closes specified ones of the switches to selects specified resistances, wherein the first circuit and the second circuit are serially connected.

12. A charge/discharge current detection circuit according to claim 11, wherein each of the first circuit and the second circuit includes a second switch added in parallel therewith.

13. A charge/discharge current detection circuit according to claim 11, wherein the switch is composed of MOS transistors, and the selection device is composed of a decoder circuit.

14. A charge/discharge current detection circuit according to claim 8, wherein the amplifier circuit is an instrumentation amplifier.

* * * * *